(12) United States Patent
Hanashima et al.

(10) Patent No.: US 11,784,044 B2
(45) Date of Patent: Oct. 10, 2023

(54) METHOD OF PROCESSING SUBSTRATE, METHOD OF MANUFACTURING SEMICONDUCTOR DEVICE, SUBSTRATE PROCESSING APPARATUS, AND RECORDING MEDIUM

(71) Applicant: Kokusai Electric Corporation, Tokyo (JP)

(72) Inventors: Takeo Hanashima, Toyama (JP); Kiyohisa Ishibashi, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

(21) Appl. No.: 18/179,293

(22) Filed: Mar. 6, 2023

(65) Prior Publication Data

US 2023/0207310 A1    Jun. 29, 2023

Related U.S. Application Data

(63) Continuation of application No. PCT/JP2020/036041, filed on Sep. 24, 2020.

(51) Int. Cl.
*H01L 21/02* (2006.01)
*C23C 16/34* (2006.01)
(Continued)

(52) U.S. Cl.
CPC ........ *H01L 21/0228* (2013.01); *C23C 16/345* (2013.01); *C23C 16/4408* (2013.01);
(Continued)

(58) Field of Classification Search
None
See application file for complete search history.

(56) References Cited

U.S. PATENT DOCUMENTS

| 6,270,572 B1 | 8/2001 | Kim et al. |
| 2010/0136260 A1* | 6/2010 | Matsunaga ....... C23C 16/45546 |
| | | 427/255.28 |

(Continued)

FOREIGN PATENT DOCUMENTS

| JP | 2000-054134 A | 2/2000 |
| JP | 2012-104720 A | 5/2012 |
| JP | 2014-208883 A | 11/2014 |

OTHER PUBLICATIONS

International Search Report, PCT/JP2020/036041, dated Dec. 1, 2020, 5 pgs.

*Primary Examiner* — Asok K Sarkar
(74) *Attorney, Agent, or Firm* — Volpe Koenig

(57) ABSTRACT

There is provided a technique that includes: forming a film on a substrate including a recess formed on a surface of the substrate by performing a cycle a predetermined number of times, the cycle including: (a) supplying a precursor gas to the substrate; and (b) supplying a reaction gas to the substrate, wherein in (a), the precursor gas is supplied to the substrate separately a plurality of times, and a processing condition under which the precursor gas is supplied for a first time is set to a processing condition under which self-decomposition of the precursor gas is capable of being more suppressed than a processing condition under which the precursor gas is supplied for at least one subsequent time after the first time.

21 Claims, 5 Drawing Sheets

(51) Int. Cl.
*C23C 16/44* (2006.01)
*C23C 16/46* (2006.01)

(52) U.S. Cl.
CPC .......... *C23C 16/46* (2013.01); *H01L 21/0217* (2013.01); *H01L 21/02167* (2013.01); *H01L 21/02211* (2013.01)

(56) References Cited

U.S. PATENT DOCUMENTS

| | | |
|---|---|---|
| 2012/0119337 A1 | 5/2012 | Sasaki et al. |
| 2014/0295667 A1 | 10/2014 | Kaga et al. |
| 2016/0284542 A1* | 9/2016 | Noda .................. H01J 37/3244 |
| 2017/0047227 A1 | 2/2017 | Kaga et al. |
| 2018/0308681 A1* | 10/2018 | Harada ............. H01L 21/76224 |
| 2022/0170154 A1* | 6/2022 | Hanashima ....... H01L 21/02211 |
| 2022/0301851 A1* | 9/2022 | Nitta ..................... C23C 16/401 |
| 2023/0093981 A1* | 3/2023 | Harada ............. H01L 21/02337 438/770 |

* cited by examiner

METHOD OF PROCESSING SUBSTRATE, METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is a Bypass Continuation Application of PCT International Application No. PCT/JP2020/036041, filed Sep. 24, 2020, the disclosure of which is incorporated herein in its entirety by reference.

TECHNICAL FIELD

The present disclosure relates to a method of processing a substrate, a method of manufacturing a semiconductor device, a substrate processing apparatus, and a recording medium.

BACKGROUND

In the related art, as a process of manufacturing a semiconductor device, a substrate processing process of supplying a precursor gas or a reaction gas to a substrate to form a film on the substrate may be carried out.

SUMMARY

Some embodiments of the present disclosure provide a technique of improving a step coverage without lowering a deposition rate of a film formed on a substrate.

According to some embodiments of the present disclosure, there is provided a technique that includes: forming a film on a substrate including a recess formed on a surface of the substrate by performing a cycle a predetermined number of times, the cycle including: (a) supplying a precursor gas to the substrate; and (b) supplying a reaction gas to the substrate, wherein in (a), the precursor gas is supplied to the substrate separately a plurality of times, and a processing condition under which the precursor gas is supplied for a first time is set to a processing condition under which self-decomposition of the precursor gas is capable of being more suppressed than a processing condition under which the precursor gas is supplied for at least one subsequent time after the first time.

BRIEF DESCRIPTION OF DRAWINGS

The accompanying drawings, which are incorporated in and constitute a portion of the specification, illustrate embodiments of the present disclosure.

DETAILED DESCRIPTION

Figure 1:
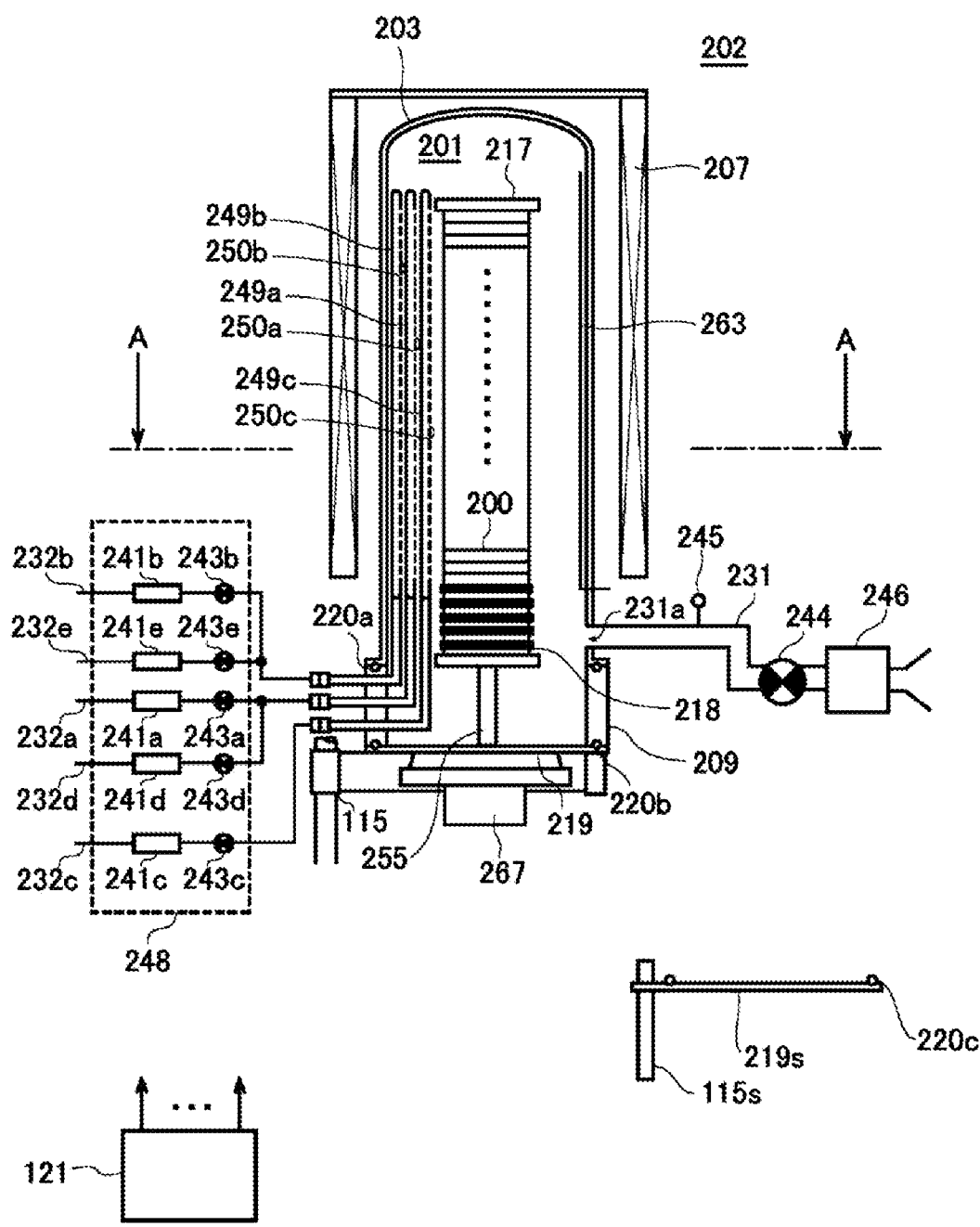
FIG. 1 is a schematic structure view of a vertical process furnace of a substrate processing apparatus suitably used in embodiments of the present disclosure, in which a portion of the process furnace is shown in a vertical cross section.

Reference will now be made in detail to various embodiments, examples of which are illustrated in the accompanying drawings. In the following detailed description, numerous specific details are set forth to provide a thorough understanding of the present disclosure. However, it will be apparent to one of ordinary skill in the art that the present disclosure may be practiced without these specific details. In other instances, well-known methods, procedures, systems, and components are not described in detail so as not to unnecessarily obscure aspects of the various embodiments.

Embodiments of the Present Disclosure

Embodiments of the present disclosure will now be described mainly with reference to FIGS. 1 to 4. The drawings used in the following description are schematic, and dimensional relationships, ratios, and the like of the respective components shown in the drawings may not match actual ones. Further, dimensional relationships, ratios, and the like of the respective components among plural drawings may not match one another.

(1) Structure of Substrate Processing Apparatus

As shown in FIG. 1, a process furnace 202 includes a heater 207 as a temperature regulator (a heating part). The heater 207 is formed in a cylindrical shape and is supported by a holding plate to be vertically installed. The heater 207 functions as an activator (an exciter) configured to activate (excite) a gas thermally.

A reaction tube 203 is disposed inside the heater 207 to be concentric with the heater 207. The reaction tube 203 is made of, for example, heat resistant material such as quartz ($SiO_2$) or silicon carbide (SiC), and is formed in a cylindrical shape with its upper end closed and its lower end opened. A manifold 209 is disposed to be concentric with the reaction tube 203 under the reaction tube 203. The manifold 209 is made of, for example, metal material such as stainless steel (SUS), and is formed in a cylindrical shape with both of its upper and lower ends opened. The upper end of the manifold 209 engages with the lower end of the reaction tube 203 to support the reaction tube 203. An O-ring 220a serving as a seal is provided between the manifold 209 and the reaction tube 203. Similar to the heater 207, the reaction tube 203 is vertically installed. A process container (reaction container) mainly includes the reaction tube 203 and the manifold 209. A process chamber 201 is formed in a hollow cylindrical portion of the process container. The process chamber 201 is configured to be capable of accommodating wafers 200 as substrates. The wafers 200 are processed in the process chamber 201.

Nozzles 249a to 249c as first to third suppliers are installed in the process chamber 201 to penetrate a sidewall of the manifold 209. The nozzles 249a to 249c are also referred to as first to third nozzles, respectively. The nozzles 249a to 249c are made of, for example, eat resistant material such as quartz or SiC. Gas supply pipes 232a to 232c are connected to the nozzles 249a to 249c, respectively. The nozzles 249a to 249c are different nozzles, and each of the nozzles 249a and 249c is installed adjacent to the nozzle 249b.

Mass flow controllers (MFCs) 241a to 241c, which are flow rate controllers (flow rate control parts), and valves 243a to 243c, which are opening/closing valves, are installed at the gas supply pipes 232a to 232c, respectively, sequentially from the upstream side of a gas flow. A gas supply pipe 232d is connected to the gas supply pipe 232a at the downstream side of the valve 243a. A gas supply pipe 232e is connected to the gas supply pipe 232b at the downstream side of the valve 243b. MFCs 241d and 241e and valves 243d and 243e are installed at the gas supply pipes 232d and 232e, respectively, sequentially from the upstream side of a gas flow. The gas supply pipes 232a to 232e are made of, for example, metal material such as SUS.

Figure 2:
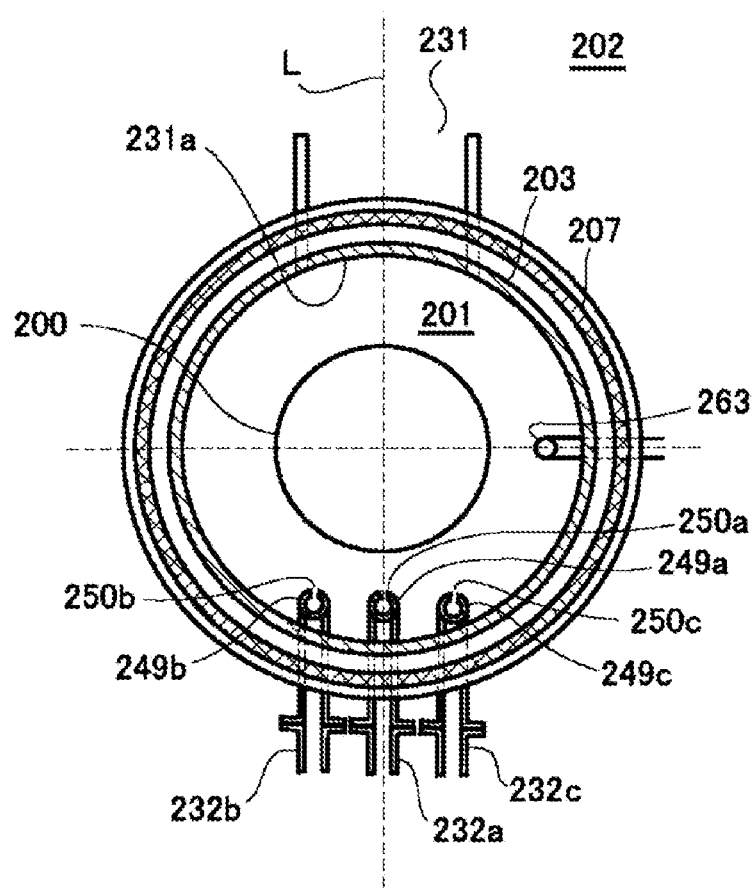
FIG. 2 is a schematic structure view of the vertical process furnace of the substrate processing apparatus suitably used in the embodiments of the present disclosure, in which a portion of the process furnace is shown in a cross section taken along line A-A in FIG. 1.

As shown in FIG. 2, each of the nozzles 249a to 249c is installed in an annular space in a plane view between an inner wall of the reaction tube 203 and the wafers 200 to extend upward from a lower side to an upper side of the inner wall of the reaction tube 203, that is, along an arrangement direction of the wafers 200. Specifically, each of the nozzles 249a to 249c is installed in a region horizontally surrounding a wafer arrangement region in which the wafers 200 are arranged at a lateral side of the wafer arrangement region, along the wafer arrangement region. In the plane view, the nozzle 249a is disposed to face an exhaust port 231a described below on a straight line across the centers of the wafers 200 loaded into the process chamber 201. The nozzles 249b and 249c are arranged to sandwich a straight line L passing through the nozzle 249a and the center of the exhaust port 231a from both sides along the inner wall of the reaction tube 203 (outer peripheral sides of the wafers 200). The straight line L is also a straight line passing through the nozzle 249a and the centers of the wafers 200. That is, the nozzle 249c may be installed on the side opposite to the nozzle 249b with the straight line L interposed therebetween. The nozzles 249b and 249c are arranged in a line-symmetry relationship with the straight line L as an axis of symmetry. Gas supply holes 250a to 250c configured to supply a gas are formed on the side surfaces of the nozzles 249a to 249c, respectively. Each of the gas supply holes 250a to 250c is opened to oppose (face) the exhaust port 231a in the plane view, which enables the gas to be supplied toward the wafers 200. A plurality of gas supply holes 250a to 250c are formed from the lower side to the upper side of the reaction tube 203.

A precursor gas is supplied from the gas supply pipe 232a into the process chamber 201 via the MFC 241a, the valve 243a, and the nozzle 249a.

A reaction gas is supplied from the gas supply pipe 232b into the process chamber 201 via the MFC 241b, the valve 243b, and the nozzle 249b. The reaction gas is substance differing in a molecular structure (chemical structure) from the precursor gas.

An inert gas is supplied from the gas supply pipes 232d and 232e into the process chamber 201 via the MFCs 241d and 241e, the valves 243d and 243e, the gas supply pipes 232a and 232b, and the nozzles 249a and 249b, respectively. An inert gas is supplied from the gas supply pipe 232c into the process chamber 201 via the MFC 241c, the valve 243c, and the nozzle 249c. The inert gas acts as a purge gas, a carrier gas, a dilution gas, or the like.

A precursor gas supply system mainly includes the gas supply pipe 232a, the MFC 241a, and the valve 243a. A reaction gas supply system mainly includes the gas supply pipe 232b, the MFC 241b, and the valve 243b. An inert gas supply system mainly includes the gas supply pipes 232c to 232e, the MFCs 241c to 241e, and the valves 243c to 243e.

Each or both of the precursor gas and the reaction gas is also referred to as a film-forming gas, and each or both of the precursor gas supply system and the reaction gas supply system is also referred to as a film-forming gas supply system.

One or the entirety of the above-described various gas supply systems may be constituted as an integrated gas supply system 248 in which the valves 243a to 243e, the MFCs 241a to 241e, and so on are integrated. The integrated gas supply system 248 is connected to each of the gas supply pipes 232a to 232e, and is configured such that operations of supplying various gases into the gas supply pipes 232a to 232e, that is, the opening/closing operation of the valves 243a to 243e, the flow rate regulating operation by the MFCs 241a to 241e, and the like, are controlled by a controller 121 described below. The integrated gas supply system 248 is constituted as an integral or detachable integrated unit, and may be attached to or detached from the gas supply pipes 232a to 232e and the like on an integrated unit basis, such that maintenance, replacement, extension, and the like of the integrated gas supply system 248 may be performed on an integrated unit basis.

The exhaust port 231a configured to exhaust an internal atmosphere of the process chamber 201 is installed below the sidewall of the reaction tube 203. As shown in FIG. 2, in the plan view, the exhaust port 231a is installed at a position opposing (facing) the nozzles 249a to 249c (the gas supply holes 250a to 250c) with the wafers 200 interposed therebetween. The exhaust port 231a may be installed from a lower side to an upper side of the sidewall of the reaction tube 203, that is, along the wafer arrangement region. An exhaust pipe 231 is connected to the exhaust port 231a. The exhaust pipe 231 is made of, for example, metal material such as SUS. A vacuum pump 246 as a vacuum exhauster is connected to the exhaust pipe 231 via a pressure sensor 245, which is a pressure detector (pressure detection part) configured to detect an internal pressure of the process chamber 201, and an auto pressure controller (APC) valve 244, which is a pressure regulator (pressure regulation part). The APC valve 244 is configured to be capable of performing or stopping a vacuum exhausting operation in the process chamber 201 by opening/closing the valve while the vacuum pump 246 is actuated, and is also configured to be capable of regulating the internal pressure of the process chamber 201 by adjusting an opening state of the valve based on pressure information detected by the pressure sensor 245 while the vacuum pump 246 is actuated. An exhaust system mainly includes the exhaust pipe 231, the APC valve 244, and the pressure sensor 245. The exhaust system may include the vacuum pump 246.

A seal cap 219, which serves as a furnace opening lid configured to be capable of hermetically sealing a lower end opening of the manifold 209, is installed under the manifold 209. The seal cap 219 is made of, for example, metal material such as SUS, and is formed in a disc shape. An O-ring 220b, which is a seal making contact with the lower end of the manifold 209, is installed on an upper surface of the seal cap 219. A rotator 267 configured to rotate a boat 217 described below, is installed under the seal cap 219. A rotary shaft 255 of the rotator 267 is made of, for example, metal material such as SUS, and is connected to the boat 217 through the seal cap 219. The rotator 267 is configured to rotate the wafers 200 by rotating the boat 217. The seal cap 219 is configured to be vertically moved up or down by a boat elevator 115 which is an elevator installed outside the reaction tube 203. The boat elevator 115 is constituted as a transfer apparatus (transfer mechanism) which loads or unloads (transfers) the wafers 200 into or out of the process chamber 201 by moving the seal cap 219 up or down.

A shutter 219s, which serves as a furnace opening lid configured to be capable of hermetically sealing a lower end opening of the manifold 209 in a state where the seal cap 219 is lowered and the boat 217 is unloaded from the process chamber 201, is installed under the manifold 209. The shutter 219s is made of, for example, metal material such as SUS, and is formed in a disc shape. An O-ring 220c, which is a seal making contact with the lower end of the manifold 209, is installed on an upper surface of the shutter 219s. The opening/closing operation (such as elevation operation, rotation operation, or the like) of the shutter 219s is controlled by a shutter opening/closing mechanism 115s.

The boat 217 serving as a substrate support is configured to support a plurality of wafers 200, for example, 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 to be spaced apart from each other. The boat 217 is made of, for example, heat resistant material such as quartz or SiC. Heat insulating plates 218 made of, for example, heat resistant material such as quartz or SiC are installed below the boat 217 in multiple stages.

A temperature sensor 263 serving as a temperature detector is installed in the reaction tube 203. Based on temperature information detected by the temperature sensor 263, a state of supplying electric power to the heater 207 is regulated such that a temperature distribution inside the process chamber 201 becomes a desired temperature distribution. The temperature sensor 263 is installed along the inner wall of the reaction tube 203.

Figure 3:
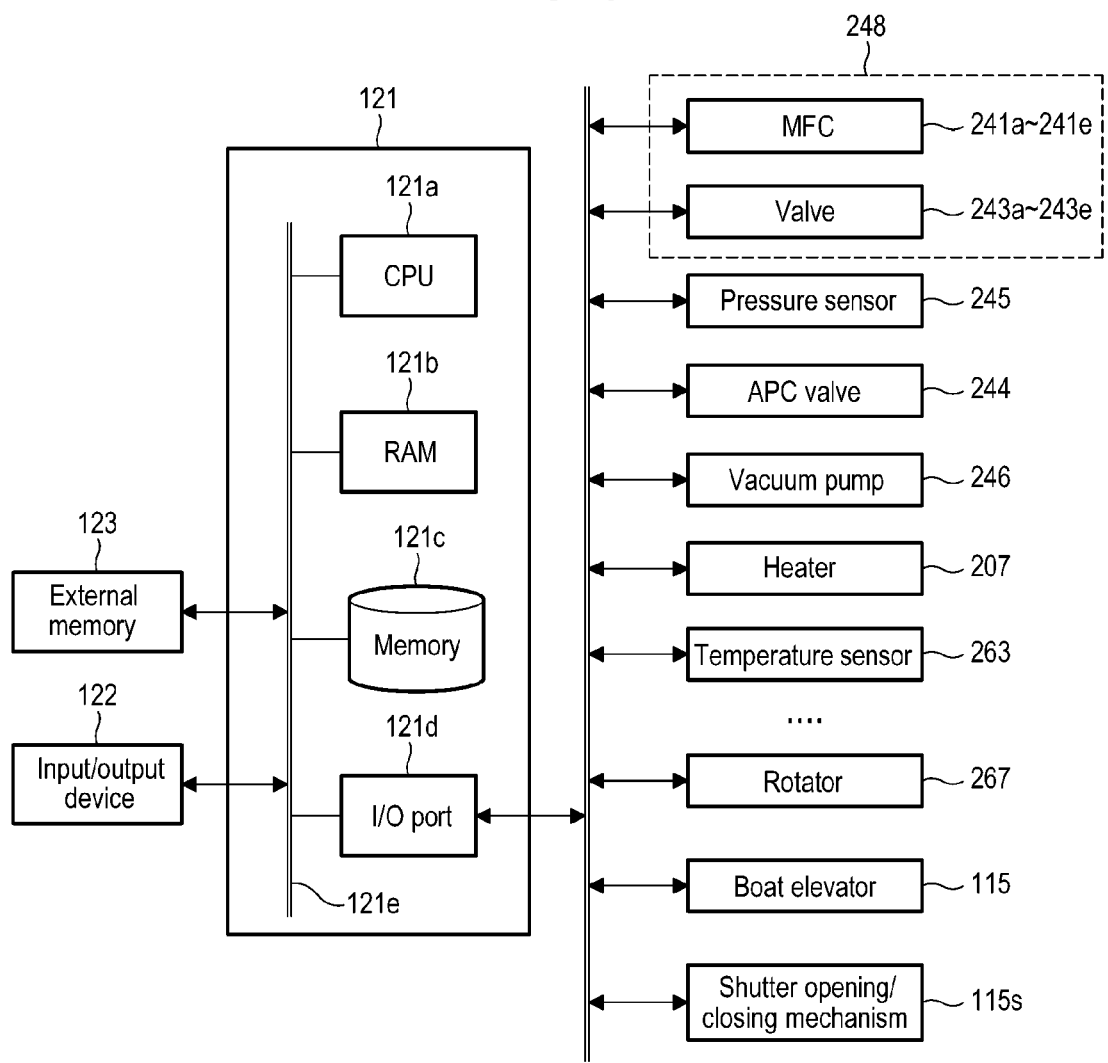
FIG. 3 is a schematic structure diagram of a controller of the substrate processing apparatus suitably used in the embodiments of the present disclosure, in which a control system of the controller is shown in a block diagram.

As shown in FIG. 3, a controller 121, which is a control part (control means or unit), is constituted as a computer including a central processing unit (CPU) 121a, a random access memory (RAM) 121b, a memory 121c, and an I/O port 121d. The RAM 121b, the memory 121c, and the I/O port 121d are configured to be capable of exchanging data with the CPU 121a via an internal bus 121e. An input/output device 122 including, e.g., a touch panel or the like, is connected to the controller 121.

The memory 121c includes, for example, a flash memory, a hard disk drive (HDD), a solid state drive (SSD), or the like. A control program that controls operations of a substrate processing apparatus, a process recipe in which sequences and conditions of substrate processing described below are written, and the like are readably stored in the memory 121c. The process recipe functions as a program configured to cause the controller 121 to perform each sequence in the substrate processing described below, to obtain an expected result. Hereinafter, the process recipe and the control program may be generally and simply referred to as a "program." Furthermore, the process recipe may be simply referred to as a "recipe." When the term "program" is used herein, it may indicate a case of including the recipe, a case of including the control program, or a case of including both the recipe and the control program. The RAM 121b is configured as a memory area (work area) in which programs or data read by the CPU 121a are temporarily stored.

The I/O port 121d is connected to the MFCs 241a to 241e, the valves 243a to 243e, the pressure sensor 245, the APC valve 244, the vacuum pump 246, the temperature sensor 263, the heater 207, the rotator 267, the boat elevator 115, the shutter opening/closing mechanism 115s, and so on.

The CPU 121a is configured to read and execute the control program from the memory 121c. The CPU 121a is also configured to be capable of reading the recipe from the memory 121c according to an input of an operation command from the input/output device 122. The CPU 121a is configured to be capable of controlling the flow rate regulating operation of various kinds of gases by the MFCs 241a to 241e, the opening/closing operation of the valves 243a to 243e, the opening/closing operation of the APC valve 244, the pressure regulating operation performed by the APC valve 244 based on the pressure sensor 245, the actuating and stopping operation of the vacuum pump 246, the temperature regulating operation performed by the heater 207 based on the temperature sensor 263, the operation of rotating the boat 217 with the rotator 267 and adjusting a rotation speed of the boat 217, the operation of moving the boat 217 up or down by the boat elevator 115, the opening/closing operation of the shutter 219s by the shutter opening/closing mechanism 115s, and so on, according to contents of the read recipe.

The controller 121 may be constituted by installing, on the computer, the aforementioned program stored in an external memory 123. Examples of the external memory 123 may include a magnetic disk such as a HDD, an optical disc such as a CD, a magneto-optical disc such as a MO, a semiconductor memory such as a USB memory or a SSD, and the like. The memory 121c or the external memory 123 is constituted as a computer-readable recording medium. Hereinafter, the memory 121c and the external memory 123 may be generally and simply referred to as a "recording medium." When the term "recording medium" is used herein, it may indicate a case of including the memory 121c, a case of including the external memory 123, or a case of including both the memory 121c and the external memory 123. Further, the program may be provided to the computer by using communication means or unit such as the Internet or a dedicated line, instead of using the external memory 123.

(2) Substrate Processing Process

As a process of manufacturing a semiconductor device by using the above-described substrate processing apparatus, an example of a sequence of processing a wafer 200 as a substrate, that is, an example of a film-forming sequence of forming a film on the wafer 200, will be described mainly with reference to FIG. 4. Further, in some embodiments of the present disclosure, an example of using a silicon substrate (silicon wafer) including a recess such as a trench or a hole on its surface, as the wafer 200, will be described. In the following descriptions, the operations of the respective components constituting the substrate processing apparatus are controlled by the controller 121.

A film-forming sequence in the embodiments includes:

forming a film on a wafer 200 including a recess formed on a surface of the wafer 200 by performing a cycle a predetermined number of times (n times, where n is an integer of 1 or more), the cycle including non-simultaneously performing:

Step A of supplying a precursor gas to the wafer 200; and

Step B of supplying a reaction gas to the wafer 200.

Further, in the film-forming sequence of the embodiments, in Step A, the precursor gas is supplied to the wafer 200 separately a plurality of times (m times, where m is an integer of 2 or more), and a processing condition under which the precursor gas is supplied for a first time is set to a processing condition under which self-decomposition of the precursor gas may be more suppressed than a processing condition under which the precursor gas is supplied for at least one subsequent time after the first time. FIG. 4 shows, as an example, a case where the precursor gas is supplied to the wafer 200 separately and intermittently three times (when m=3) in Step A.

In the present disclosure, for the sake of convenience, the above-described film-forming sequence may be denoted as follows. The same denotation may be used in other embodiments and modifications described below.

(Precursor gas×m→Reaction gas)×n

Figure 4:
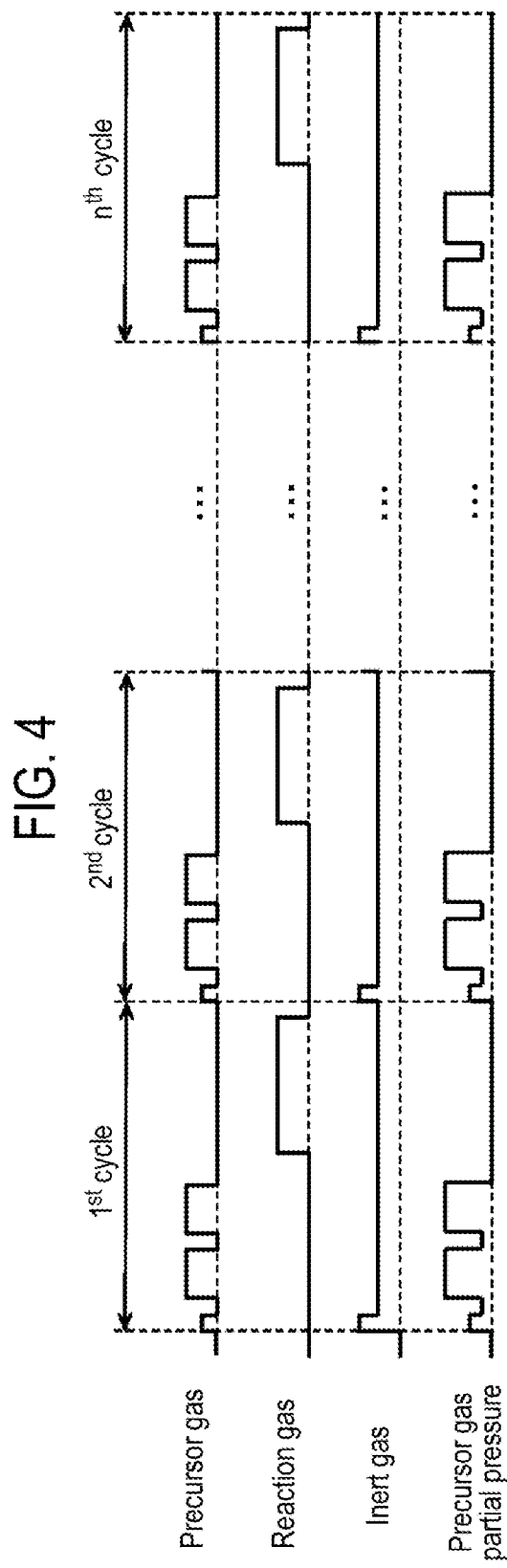
FIG. 4 is a flow diagram showing a film-forming sequence in the embodiments of the present disclosure, which illustrates supply timings of a precursor gas, a reaction gas, and an inert gas and a change in precursor gas partial pressure.

Further, as shown in FIG. 4, when Step A and Step B are alternately performed n times (n is an integer of 1 or more), a step of purging the inside of the process chamber 201 may be interposed therebetween. Further, as shown in FIG. 4, when the precursor gas is supplied separately and intermittently m times (m is an integer of 1 or more), a step of purging the inside of the process chamber 201 may be interposed therebetween. The film-forming sequence in this case may be shown as follows.

[(Precursor gas→Purging)×m→Reaction gas→Purging]×n

FIG. 4 shows an example of gas supply timing of each of the precursor gas, the reaction gas, and the inert gas as an example of the film-forming sequence in the embodiments of the present disclosure, and an example of a change in a precursor gas partial pressure accompanying the example of gas supply timing.

When the term "wafer" is used in the present disclosure, it may refer to "a wafer itself" or "a wafer and a stacked body of certain layers or films formed on a surface of the wafer." When the phrase "a surface of a wafer" is used in the present disclosure, it may refer to "a surface of a wafer itself" or "a surface of a certain layer and the like formed on a wafer." When the expression "a certain layer is formed on a wafer" is used in the present disclosure, it may mean that "a certain layer is formed directly on a surface of a wafer itself" or that "a certain layer is formed on a layer and the like formed on a wafer." When the term "substrate" is used in the present disclosure, it may be synonymous with the term "wafer."

Wafer Charging and Boat Loading

After the boat 217 is charged with a plurality of wafers 200 (wafer charging), the shutter 219s is moved by the shutter opening/closing mechanism 115s to open the lower end opening of the manifold 209 (shutter opening). Thereafter, as shown in FIG. 1, the boat 217 supporting the plurality of wafers 200 is lifted by the boat elevator 115 to be loaded into the process chamber 201 (boat loading). In this state, the seal cap 219 seals the lower end of the manifold 209 via the O-ring 220b.

Pressure Regulation and Temperature Regulation

After the boat loading is completed, the inside of the process chamber 201, that is, a space where the wafers 200 are placed, is vacuum-exhausted (decompression-exhausted) by the vacuum pump 246 to reach a desired pressure (state of vacuum). At this time, the internal pressure of the process chamber 201 is measured by the pressure sensor 245, and the APC valve 244 is feedback-controlled based on the measured pressure information (pressure regulation). Further, the wafers 200 in the process chamber 201 are heated by the heater 207 to a desired processing temperature. At this time, a state of supplying electric power to the heater 207 is feedback-controlled based on the temperature information detected by the temperature sensor 263 such that a temperature distribution inside the process chamber 201 becomes a desired temperature distribution (temperature regulation). Further, the rotation of the wafers 200 by the rotator 267 is started. The exhaust of the inside of the process chamber 201 and the heating and rotation of the wafers 200 are continuously performed at least until the processing on the wafers 200 is completed.

Film-Forming Process

Thereafter, the following Steps A and B are executed sequentially.

Step A

In this step, a precursor gas is supplied to the wafer 200 separately a plurality of times in the process chamber 201. Specifically, Step a1 of supplying the precursor gas to the wafer 200 and Step a2 of purging the inside of the process chamber 201, which is a space in which the wafer 200 exists, are alternately performed a plurality of times (m times, where m is an integer of 2 or more).

In Step a1, the valve 243a is opened to allow the precursor gas to flow through the gas supply pipe 232a. A flow rate of the precursor gas is regulated by the MFC 241a, and the precursor gas is supplied into the process chamber 201 via the nozzle 249a and is exhausted via the exhaust port 231a. In this operation, the precursor gas is supplied to the wafer 200 (precursor gas supply). At this time, the valves 243c to 243e are opened to allow an inert gas to be supplied into the process chamber 201 via the nozzles 249a to 249c, respectively. In some methods described below, the inert gas may not be supplied into the process chamber 201.

In Step a2, the valve 243a is closed to stop the supply of the precursor gas into the process chamber 201. Then, the inside of the process chamber 201 is vacuum-exhausted to remove a gas and the like remaining in the process chamber 201 from the inside of the process chamber 201. At this time, the valves 243c to 243e are opened to allow an inert gas as a purge gas to be supplied into the process chamber 201 and exhaust the inert gas from the exhaust port 231a to purge the inside of the process chamber 201 with the inert gas (purging).

For example, when a chlorosilane gas described below is used as the precursor gas, by alternately performing Steps a1 and a2 a predetermined number of times under a processing condition described below to divide and supply the chlorosilane gas to the wafer 200 a plurality of times, a silicon (Si)-containing layer containing chlorine (Cl) with a predetermined thickness is formed as a first layer on the outermost surface of the wafer 200 as a base. The Si-containing layer containing Cl is formed by physical adsorption or chemical adsorption of molecules of the chlorosilane gas, physical adsorption or chemical adsorption of molecules of substance obtained by partially decomposing the chlorosilane gas, deposition of Si by thermal decomposition of the chlorosilane gas, and the like on the outermost surface of the wafer 200. The Si-containing layer containing Cl may be an adsorption layer (physical adsorption layer or chemical adsorption layer) of molecules of the chlorosilane gas or molecules of substance obtained by partially decomposing the chlorosilane gas, or a Si deposition layer containing Cl. When the above-mentioned chemical adsorption layer or the above-mentioned deposition layer is formed on the outermost surface of the wafer 200, Si contained in the chlorosilane gas is adsorbed on the outermost surface of the wafer 200. In the present disclosure, the Si-containing layer containing Cl is also simply referred to as a Si-containing layer.

As the precursor gas, for example, a silane-based gas containing Si as a main element constituting a film formed on the wafer 200 may be used. As the silane-based gas, for example, a gas containing Si and a halogen, that is, a halosilane gas, may be used. The halogen may be chlorine (Cl), fluorine (F), bromine (Br), iodine (I), and the like. As the halosilane gas, for example, a chlorosilane gas containing Si and Cl may be used.

Examples of the precursor gas may include chlorosilane gases such as a monochlorosilane ($SiH_3Cl$, abbreviation: MCS) gas, a dichlorosilane ($SiH_2Cl_2$, abbreviation: DCS) gas, a trichlorosilane ($SiHCl_3$, abbreviation: TCS) gas, a tetrachlorosilane ($SiCl_4$, abbreviation: STC) gas, a hexachlorodisilane ($Si_2Cl_6$, abbreviation: HCDS) gas, and an octachlorotrisilane ($Si_3Cl_8$, abbreviation: OCTS) gas. One or more selected from the group of these gases may be used as the precursor gas.

In addition to the chlorosilane gases, examples of the precursor gas may include fluorosilane gases such as a tetrafluorosilane ($SiF_4$) gas and a difluorosilane ($SiH_2F_2$) gas, bromosilane gases such as a tetrabromosilane ($SiBr_4$) gas and a dibromosilane ($SiH_2Br_2$) gas, and iodosilane gases such as a tetraiodosilane ($SiI_4$) gas and a diiodosilane ($SiH_2I_2$) gas. One or more selected from the group of these gases may be used as the precursor gas.

In addition to these gases, as the precursor gas, for example, a gas containing Si and an amino group, that is, an aminosilane gas, may also be used. The amino group is a monovalent functional group obtained by removing hydrogen (H) from ammonia, primary amine, or secondary amine, and may be expressed as $-NH_2$, $-NHR$, or $-NR_2$. R represents an alkyl group, and the two R's in $-NR_2$ may be the same or different.

Examples of the precursor gas may include aminosilane gases such as a tetrakis(dimethylamino)silane ($Si[N(CH_3)_2]_4$, abbreviation: 4DMAS) gas, a tris(dimethylamino)silane ($Si[N(CH_3)_2]_3H$, abbreviation: 3DMAS) gas, a bis(diethylamino)silane ($Si[N(C_2H_5)_2]_2H_2$, abbreviation: BDEAS) gas, a bis(tert-butylamino)silane ($SiH_2[NH(C_4H_9)]_2$, abbreviation: BTBAS) gas, and a (diisopropylamino)silane ($SiH_3[N(C_3H_7)_2]$, abbreviation: DIPAS) gas. One or more selected from the group of these gases may be used as the precursor gas.

As the inert gas, for example, a nitrogen ($N_2$) gas and rare gases such as an argon (Ar) gas, a helium (He) gas, a neon (Ne) gas, and a xenon (Xe) gas may be used. One or more selected from the group of these gases may be used as the inert gas. The same applies in each step described below.

Step B

After Step A is completed, a reaction gas is supplied to the wafer 200 in the process chamber 201, that is, the Si-containing layer as the first layer formed on the wafer 200.

Specifically, the valve 243b is opened to allow the reaction gas to flow through the gas supply pipe 232b. A flow rate of the reaction gas is regulated by the MFC 241b, and the reaction gas is supplied into the process chamber 201 via the nozzle 249b and is exhausted via the exhaust port 231a. In this operation, the reaction gas is supplied to the wafer 200 (reaction gas supply). At this time, the valves 243c to 243e are opened to allow an inert gas to be supplied into the process chamber 201 via the nozzles 249a to 249c, respectively. In some methods described below, the supply of the inert gas into the process chamber 201 may not be performed.

For example, when a nitriding gas described below is used as the reaction gas, at least a portion of the Si-containing layer formed on the wafer 200 is nitrided (modified) by supplying the nitriding gas to the wafer 200 under a processing condition described below. As a result, a silicon nitride layer (SiN layer) is formed as a second layer, which is a layer obtained by nitriding the Si-containing layer, that is, a layer containing Si and N, on the outermost surface of the wafer 200 as the base. Impurities such as Cl contained in the Si-containing layer when forming the SiN layer form a gaseous substance containing at least Cl in the process of a modifying reaction of the Si-containing layer by the nitriding gas and are discharged from the inside of the process chamber 201. As a result, the SiN layer becomes a layer containing fewer impurities such as Cl than the Si-containing layer formed in Step A.

After the SiN layer as the second layer is formed, the valve 243b is closed to stop the supply of the nitriding gas into the process chamber 201. Then, a gas and the like remaining in the process chamber 201 is removed from the process chamber 201 according to the same processing procedure as the purging in Step A (purging).

As the reaction gas, for example, a nitrogen (N)- and hydrogen (H)-containing gas, which is a nitriding gas (nitriding agent), may be used. The N- and H-containing gas is both a N-containing gas and a H-containing gas. The N- and H-containing gas may contain a N—H bond.

As the reaction gas, for example, hydrogen nitride-based gases such as an ammonia ($NH_3$) gas, a diazene ($N_2H_2$) gas, a hydrazine ($N_2H_4$) gas, and a $N_3H_8$ gas may be used. One or more selected from the group of these gases may be used as the reaction gas.

In addition to these gases, as the reaction gas, for example, nitrogen (N)-, carbon (C)- and hydrogen (H)-containing gas may be used. As the N-, C- and H-containing gas, for example, an amine-based gas and an organic hydrazine-based gas may be used. The N-, C- and H-containing gas is a N-containing gas, a C-containing gas, a H-containing gas, and also a N- and C-containing gas.

Examples of the reaction gas may include ethylamine-based gases such as a monoethylamine ($C_2H_5NH_2$, abbreviation: MEA) gas, a diethylamine ($(C_2H_5)_2NH$, abbreviation: DEA) gas, and a triethylamine ($(C_2H_5)_3N$, abbreviation: TEA) gas, methylamine-based gases such as a monomethylamine ($CH_3NH_2$, abbreviation: MMA) gas, a dimethylamine ($(CH_3)_2NH$, abbreviation: DMA) gas, and a trimethylamine ($(CH_3)_3N$, abbreviation: TMA) gas, organic hydrazine-based gases such as a monomethylhydrazine ($(CH_3)HN_2H_2$, abbreviation: MMH) gas, a dimethylhydrazine ($(CH_3)_2N_2H_2$, abbreviation: DMH) gas, and a trimethylhydrazine ($(CH_3)_2N_2(CH_3)H$, abbreviation: TMH) gas, and the like. One or more of these gases can be used as the reaction gas.

Performing Predetermined Number of Times

By performing a cycle a predetermined number of times (n times, where n is an integer of 1 or more), the cycle including non-simultaneously, that is, without synchronization, performing the above-described Steps A and B, for example, a silicon nitride film (SiN film) may be formed as a film on the surface of the wafer 200. The above-described cycle may be performed a plurality of times. That is, a thickness of the SiN layer formed per cycle may be set to be smaller than a desired film thickness, and the above-described cycle may be performed a plurality of times until a thickness of a SiN film formed by stacking the SiN layers reaches a desired thickness. Further, when the N-, C-, and H-containing gas is used as the reaction gas, for example, a silicon carbonitride layer (SiCN layer) may also be formed as the second layer, and for example, a silicon carbonitride film (SiCN film) may also be formed as a film on the surface of the wafer 200 by performing the above-described cycle a predetermined number of times.

Further, as described above, in the embodiments of the present disclosure, the precursor gas may be supplied separately a plurality of times (m times, where m is an integer of 2 or more) in Step A. At this time, that is, when the precursor gas is supplied separately and intermittently in a pulse-supplied manner a plurality of times in Step A, a processing condition under which the precursor gas is supplied for the first time may be set to a processing condition under which self-decomposition (vapor phase decomposition) of the precursor gas may be more suppressed than a processing condition under which the precursor gas is supplied for at least one subsequent time after the first time.

For example, in Step A, the precursor gas may be supplied separately a plurality of times, and at this time, the processing condition under which the precursor gas is supplied for the first time may be set to a processing condition under which generation of intermediates of the precursor gas may be more suppressed than the processing condition under which the precursor gas is supplied for at least one subsequent time after the first time.

Further, for example, in Step A, the precursor gas may be supplied separately a plurality of times, and at this time, the processing condition under which the precursor gas is supplied for the first time may be set to a processing condition under which the self-decomposition of the precursor gas may be suppressed, and the processing condition under which the precursor gas is supplied for at least one subsequent time after the first time may be set to a processing condition under which the precursor gas is self-decomposed.

Further, for example, in Step A, the precursor gas may be supplied separately a plurality of times, and at this time, the processing condition under which the precursor gas is supplied for the first time may be set to the processing condition under which generation of intermediates of the precursor gas is suppressed, and the processing condition under which the precursor gas is supplied for at least one subsequent time after the first time may be set to a processing condition under which intermediates of the precursor gas are generated.

Further, for example, in Step A, the precursor gas may be supplied separately a plurality of times, and at this time, a supply duration of the precursor gas when the precursor gas is supplied for the first time may be shorter than a supply duration of the precursor gas when the precursor gas is supplied for at least one subsequent time after the first time.

Further, for example, in Step A, the precursor gas may be supplied separately a plurality of times, and at this time, a supply flow rate of the precursor gas when the precursor gas is supplied for the first time may be lower than a supply flow rate of the precursor gas when the precursor gas is supplied for at least one subsequent time after the first time.

Further, for example, in Step A, the precursor gas may be supplied separately a plurality of times, and at this time, an inert gas may be supplied as a carrier gas when the precursor gas is to the wafer 200, and a supply flow rate of the carrier gas when the precursor gas is supplied for the first time may be higher than a supply flow rate of the carrier gas when the precursor gas is supplied for at least one subsequent time after the first time.

Further, for example, in Step A, the precursor gas may be supplied separately a plurality of times, and at this time, a partial pressure of the precursor gas when the precursor gas is supplied for the first time may be lower than a partial pressure of the precursor gas when the precursor gas is supplied for at least one subsequent time after the first time.

Further, for example, in Step A, the precursor gas may be supplied separately a plurality of times, and at this time, a pressure of a space where the wafer 200 exists when the precursor gas is supplied for the first time, that is, the internal pressure of the process chamber 201 may be lower than an internal pressure of the process chamber 201 when the precursor gas is supplied for at least one subsequent time after the first time.

Further, in Step A, the precursor gas is supplied separately a plurality of times, and at this time, the internal pressure of the process chamber 201 when the precursor gas is supplied for the first time may be equal to or higher than the internal pressure of the process chamber 201 when the precursor gas is supplied for at least one subsequent time after the first time. However, in this case, by setting the supply flow rate of the inert gas that is supplied into the process chamber 201 when the precursor gas is supplied for the first time to be higher than the supply flow rate of the inert gas that is supplied into the process chamber 201 when the precursor gas is supplied for at least one subsequent time after the first time, the partial pressure of the precursor gas when the precursor gas is supplied for the first time may be lower than the partial pressure of the precursor gas when the precursor gas is supplied for at least one subsequent time after the first time.

Figure 5A:
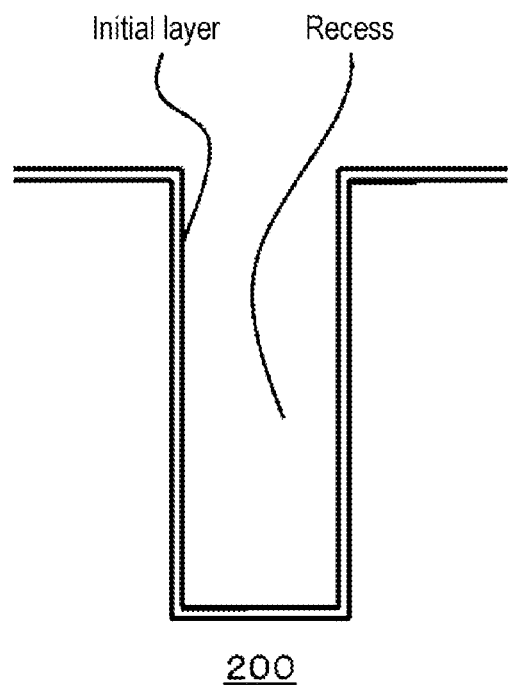
FIG. 5A is a partially enlarged cross-sectional view of a surface of a wafer after an initial layer is formed in a recess in an initial stage of Step A of the film-forming sequence in the embodiments of the present disclosure.

In this way, by dividing and supplying the precursor gas a plurality of times (m times, where m is an integer of 2 or more) in Step A and setting, at this time, the processing condition under which the precursor gas is supplied for the first time to the processing condition under which the self-decomposition of the precursor gas may be more suppressed than the processing condition under which the precursor gas is supplied for at least one subsequent time after the first time, at the initial stage of Step A, that is, at the initial stage of supply of the precursor gas, it is possible to cause atoms or molecules contained in the precursor gas to be uniformly adsorbed over the entire region in the recess formed on the surface of the wafer 200 while suppressing the self-decomposition of the precursor gas. That is, at the initial stage of supply of the precursor gas, it is possible to cause atoms or molecules contained in the precursor gas to be uniformly adsorbed over the entire region of initial adsorption sites on the outermost surface in the recess. As a result, as shown in FIG. 5A, it is possible to form the Si-containing layer with a uniform thickness over the entire region in the recess, that is, the Si-containing layer with a high step coverage, as an initial layer on the outermost surface of the recess. This layer may be a continuous layer or a discontinuous layer. In either case, the layer is formed with the high step coverage.

In this way, by forming the Si-containing layer with excellent uniformity and high step coverage as an initial layer in a region in contact with the outermost surface in the recess, even in a case where the processing condition is changed thereafter, subsequently-formed Si-containing layers tend to inherit the high uniformity and the high step coverage of the initial layer, causing the subsequently-formed layers to be formed with the high uniformity and the high step coverage.

Further, by dividing and supplying the precursor gas a plurality of times (m times, where m is an integer of 2 or more) in Step A and setting, at this time, the processing conditions under which the precursor gas is supplied for the at least one subsequent time to processing conditions under which the precursor gas may be more self-decomposed than the processing condition under which the precursor gas is supplied for the first time, it is possible to efficiently cause atoms or molecules contained in the precursor gas to be adsorbed over the entire region in the recess while relaxing a state of suppression of self-decomposition of the precursor gas, for example, while allowing the self-decomposition of the precursor gas when the precursor gas is supplied for the at least one subsequent time. That is, it is possible to form the Si-containing layer at a relatively high formation rate on the surface in the recess where the initial layer is formed. Since the Si-containing layer formed at this time is formed after forming the Si-containing layer with the high step coverage as the initial layer, it tends to inherit characteristics and state of the initial layer, and continues in the high step coverage.

Figure 5B:
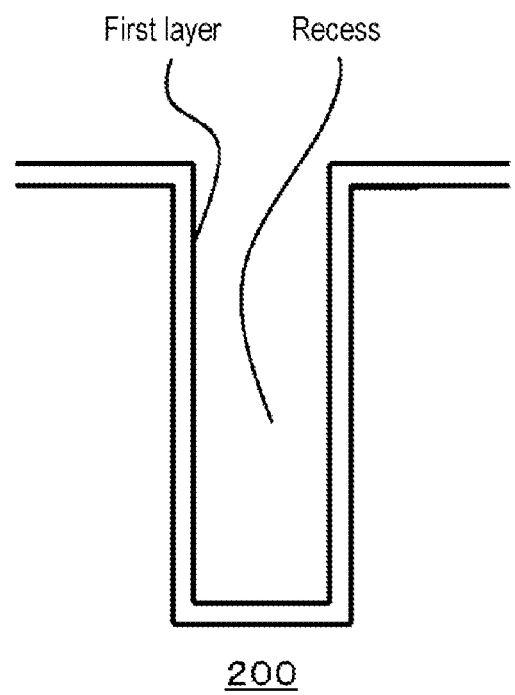
FIG. 5B is a partially enlarged cross-sectional view of the surface of the wafer after a first layer is formed in the recess in Step A of the film-forming sequence in the embodiments of the present disclosure.

As a result, it is possible to form a uniform and conformal first layer (Si-containing layer) over the entire region in the recess formed on the surface of the wafer 200, as shown in FIG. 5B, without lowering the formation rate of the Si-containing layer. As a result, it is possible to improve the step coverage without lowering a deposition rate of a film formed on the wafer 200, making it possible to form the uniform and conformal film over the entire region in the recess formed on the surface of the wafer 200.

Further, although the reason is described below, when the precursor gas is supplied separately the plurality of times (m times, where m is an integer of 2 or more) in Step A, in the case of m≥2, a duration of Step a2 of purging the inside of the process chamber 201 performed after Step a1 of supplying the precursor gas initially (for the first time) may be set shorter than a duration of Step a2 of purging the inside of the process chamber 201 performed after Step a1 of supplying the precursor gas finally (for the m-th time).

Further, when the precursor gas is supplied separately the plurality of times (m times, where m is an integer of 2 or more) in Step A, in the case of m≥3, a duration of Step a2 of purging the inside of the process chamber 201 performed after Step a1 of supplying the precursor gas at the second time may be set shorter than the duration of Step a2 of purging the inside of the process chamber 201 performed after Step a1 of supplying the precursor gas finally (for the m-th time). In this case, the duration of Step a2 of purging the inside of the process chamber 201 performed after Step a1 of supplying the precursor gas at each of the first to (m−1)-th times may be set shorter than the duration of Step a2 of purging the inside of the process chamber 201 performed after Step a1 of supplying the precursor gas finally (for the m-th time).

Further, when the precursor gas is supplied separately the plurality of times (m times, where m is an integer of 2 or more) in Step A, the duration of Step a2 of purging the inside of the process chamber 201 performed after Step a1 of supplying the precursor gas finally (for the m-th time) may be set to be the longest duration among the durations of Step a2 performed the plurality of times.

The processing conditions in the respective steps described above are exemplified below when, for example, a chlorosilane gas is used as the precursor gas and, for example, a N- and H-containing gas is used as the reaction gas. In the present disclosure, a notation of a numerical range such as "1 to 100 Pa" means that the lower limit value and the upper limit value are included in the range. Therefore, for example, "1 to 100 Pa" means "1 Pa or higher and 100 Pa or lower." The same applies to other numerical ranges. In the present disclosure, the processing temperature means the temperature of the wafer 200, and the processing pressure means the internal pressure of the process chamber 201. Further, the gas supply flow rate of 0 sccm means a case where no gas is supplied. The same applies to the following description.

A processing condition when Step a1 is performed for the first time in Step A is exemplified as follows:

Chlorosilane gas supply flow rate: 1 to 500 sccm, specifically 1 to 200 sccm;
Chlorosilane gas supply duration: 1 to 20 seconds, specifically 1 to 10 seconds;
Inert gas supply flow rate: 500 to 30,000 sccm, specifically 1,000 to 20,000 sccm;
Processing temperature: 250 to 800 degrees C., specifically 600 to 700 degrees C.;
Processing pressure: 1 to 2,666 Pa, specifically 1 to 1,333 Pa, more specifically 1 to 100 Pa; and
Chlorosilane gas partial pressure: 0.00003 to 1,333 Pa, specifically 0.00005 to 222 Pa, more specifically 0.00005 to 17 Pa.

A processing condition when Step a1 is performed for at least one subsequent time after the first time in Step A are exemplified as follows:

Chlorosilane gas supply flow rate: 1 to 2,000 sccm, specifically 10 to 1,000 sccm;
Chlorosilane gas supply duration: 5 to 40 seconds, specifically 10 to 30 seconds;
Inert gas supply flow rate: 0 to 20,000 sccm, specifically 500 to 10,000 sccm;
Processing pressure: 1 to 2,666 Pa, specifically 67 to 1,333 Pa; and
Chlorosilane gas partial pressure: 0.00005 to 2,666 Pa, specifically 0.06 to 889 Pa.

Other processing conditions may be the same as those when Step a1 is performed for the first time in Step A.

A processing condition when Step a2 is performed for the first to (m−1)-th times in Step A is exemplified as follows:

Inert gas supply flow rate: 1,000 to 20,000 sccm; and
Inert gas supply duration: 1 to 20 seconds, specifically 1 to 10 seconds.

Other processing conditions may be the same as those when Step a1 is performed for the first time in Step A.

A processing condition when Step a2 is performed finally (for the m-th time) in Step A is exemplified as follows:

Inert gas supply flow rate: 1,000 to 30,000 sccm; and
Inert gas supply duration: 5 to 60 seconds, specifically 10 to 30 seconds.

Other processing conditions may be the same as those when Step a1 is performed for the first time in Step A.

Further, when Step a2 is performed finally (for the m-th time) in Step A, the supply of the inert gas into the process chamber 201 and the exhaust of the inside of the process chamber 201 with the supply of the inert gas into the process chamber 201 stopped may be performed a plurality of times. That is, when Step a2 is performed finally (for the m-th time) in Step A, cycle purge may be performed.

A processing condition in Step B is exemplified as follows:

N- and H-containing gas supply flow rate: 1 to 20,000 sccm, specifically 1,000 to 10,000 sccm;
N- and H-containing gas supply duration: 1 to 120 seconds, specifically 1 to 60 seconds;
Inert gas supply flow rate: 0 to 20,000 sccm, specifically 500 to 10,000 sccm; and
Processing pressure: 1 to 4,000 Pa, specifically 1 to 3,000 Pa.

Other processing conditions may be the same as those when Step a1 is performed for the first time in Step A.

After-Purge and Returning to Atmospheric Pressure

After the process of forming the film with a desired thickness on the wafer 200 is completed, an inert gas as a purge gas is supplied into the process chamber 201 from each of the nozzles 249a to 249c and is exhausted via the exhaust port 231a. Thus, the inside of the process chamber 201 is purged and a gas, reaction by-products, and the like remaining in the process chamber 201 are removed from the inside of the process chamber 201 (after-purge). Thereafter, the internal atmosphere of the process chamber 201 is substituted with an inert gas (inert gas substitution) and the internal pressure of the process chamber 201 is returned to the normal pressure (returning to atmospheric pressure).

Boat Unloading and Wafer Discharging

Thereafter, the seal cap 219 is moved down by the boat elevator 115 to open the lower end of the manifold 209. Then, the processed wafers 200 supported by the boat 217 are unloaded from the lower end of the manifold 209 to the outside of the reaction tube 203 (boat unloading). After the boat unloading, the shutter 219s is moved and the lower end opening of the manifold 209 is sealed by the shutter 219s via the O-ring 220c (shutter closing). The processed wafers 200 are unloaded from the reaction tube 203 and are then discharged from the boat 217 (wafer discharging).

(3) Effects of the Embodiments

According to the embodiments of the present disclosure, one or more selected from the group of effects set forth below may be achieved.

(a) In Step A, by dividing and supplying the precursor gas the plurality of times and setting, at this time, the processing condition under which the precursor gas is supplied for the first time to the processing condition under which the self-decomposition of the precursor gas may be more suppressed than the processing condition under which the precursor gas is supplied for at least one subsequent time after the first time, it is possible to cause atoms or molecules contained in the precursor gas to be uniformly adsorbed over the entire region in the recess while suppressing the self-decomposition of the precursor gas at the initial stage of supply of the precursor gas. Thereafter, it is possible to cause atoms or molecules contained in the precursor gas to be efficiently adsorbed over the entire region in the recess while relaxing the state of suppression of self-decomposition of the precursor gas more than before, for example, while allowing the self-decomposition of the precursor gas. As a result, it is possible to improve the step coverage without lowering the deposition rate of the film formed on the wafer 200. Further, it is possible to improve a wafer in-plane film thickness uniformity of the film formed on the wafer 200, making it possible to reduce variation in film thickness, for example, among an upper side surface, a middle side surface, a lower side surface, and a bottom in the recess.

(b) In Step A, by dividing and supplying the precursor gas the plurality of times and setting, at this time, the processing condition under which the precursor gas is supplied for the first time to the processing condition under which the generation of intermediates of the precursor gas may be more suppressed than the processing condition under which the precursor gas is supplied for at least one subsequent time after the first time, it is possible to cause atoms or molecules contained in the precursor gas to be uniformly adsorbed over the entire region in the recess while suppressing the generation of intermediates of the precursor gas at the initial stage of supply of the precursor gas. Thereafter, it is possible to cause atoms or molecules contained in the precursor gas to be efficiently adsorbed over the entire region in the recess while relaxing the state of suppression of the generation of intermediates of the precursor gas more than before, for example, while allowing the generation of intermediates of the precursor gas. As a result, it is possible to improve the step coverage without lowering the deposition rate of the film formed on the wafer 200. Further, it is possible to improve the wafer in-plane film thickness uniformity of the film formed on the wafer 200.

(c) In Step A, by dividing and supplying the precursor gas the plurality of times, setting, at this time, the processing condition under which the precursor gas is supplied for the first time to the processing condition under which the self-decomposition of the precursor gas may be suppressed, and setting the processing condition under which the precursor gas is supplied for at least one subsequent time after the first time to the processing condition under which the precursor gas is self-decomposed, it is possible to cause atoms or molecules contained in the precursor gas to be uniformly adsorbed over the entire region in the recess while suppressing the generation of intermediates of the precursor gas at the initial stage of supply of the precursor gas. Thereafter, it is possible to cause atoms or molecules contained in the precursor gas to be efficiently adsorbed over the entire region in the recess while self-decomposing the precursor gas. As a result, it is possible to improve the step coverage without lowering the deposition rate of the film formed on the wafer 200. Further, it is possible to improve the wafer in-plane film thickness uniformity of the film formed on the wafer 200. Further, according to this method, it is possible to increase the efficiency of adsorption of atoms or molecules contained in the precursor gas on the inside of the recess when the precursor gas is supplied for the at least one subsequent time, making it possible to further increase the deposition rate.

(d) In Step A, by dividing and supplying the precursor gas the plurality of times, setting, at this time, the processing condition under which the precursor gas is supplied for the first time to the processing condition under which the generation of intermediates of the precursor gas may be suppressed, and setting the processing condition under which the precursor gas is supplied for at least one subsequent time after the first time to the processing condition under which intermediates of the precursor gas is generated, it is possible to cause atoms or molecules contained in the precursor gas to be uniformly adsorbed over the entire region in the recess while suppressing the generation of intermediates of the precursor gas at the initial stage of supply of the precursor gas. Thereafter, it is possible to cause atoms or molecules contained in the precursor gas to be efficiently adsorbed over the entire region in the recess while generating the intermediates of the precursor gas. As a result, it is possible to improve the step coverage without lowering the deposition rate of the film formed on the wafer 200. Further, it is possible to improve the wafer in-plane film thickness uniformity of the film formed on the wafer 200. Further, according to this method, it is possible to increase the efficiency of adsorption of atoms or molecules contained in the precursor gas on the inside of the recess when the precursor gas is supplied for the at least one subsequent time, making it possible to further increase the deposition rate.

(e) In Step A, by dividing and supplying the precursor gas the plurality of times and setting, at this time, the supply duration of the precursor gas when the precursor gas is supplied for the first time to be shorter than the supply duration of the precursor gas when the precursor gas is supplied for at least one subsequent time after the first time, it is possible to suppress the self-decomposition of the precursor gas at the initial stage of supply of the precursor gas. Thereafter, it is possible to relatively lengthen a time for atoms or molecules contained in the precursor gas to be adsorbed on the inside of the recess while relaxing the state of suppression of self-decomposition of the precursor gas.

As a result, it is possible to improve the step coverage without lowering the deposition rate of the film formed on the wafer 200. Further, it is possible to improve the wafer in-plane film thickness uniformity of the film formed on the wafer 200.

(f) In Step A, by dividing and supplying the precursor gas the plurality of times and setting, at this time, the supply flow rate of the precursor gas when the precursor gas is supplied for the first time to be lower than the supply flow rate of the precursor gas when the precursor gas is supplied for the at least one subsequent time, it is possible to suppress the self-decomposition of the precursor gas at the initial stage of supply of the precursor gas. Thereafter, it is possible to relatively increase the supply flow rate of the precursor gas when causing atoms or molecules contained in the precursor gas to be adsorbed on the inside of the recess while relaxing the state of suppression of self-decomposition of the precursor gas. As a result, it is possible to improve the step coverage without lowering the deposition rate of the film formed on the wafer 200. Further, it is possible to improve the wafer in-plane film thickness uniformity of the film formed on the wafer 200.

(g) In Step A, by dividing and supplying the precursor gas the plurality of times, supplying, at this time, the inert gas as the carrier gas when the precursor gas supplied to the wafer 200, and setting the supply flow rate of the carrier gas when the precursor gas is supplied for the first time to be higher than the supply flow rate of the carrier gas when the precursor gas is supplied for at least one subsequent time after the first time, it is possible to suppress the self-decomposition of the precursor gas at the initial stage of supply of the precursor gas. Thereafter, it is possible to cause atoms or molecules contained in the precursor gas to be efficiently adsorbed over the entire region in the recess by relatively decreasing the supply flow rate of the carrier gas when atoms or molecules contained in the precursor gas are adsorbed on the inside of the recess, while relaxing the state of suppression of self-decomposition of the precursor gas. As a result, it is possible to improve the step coverage without lowering the deposition rate of the film formed on the wafer 200. Further, it is possible to improve the wafer in-plane film thickness uniformity of the film formed on the wafer 200.

(h) In Step A, by dividing and supplying the precursor gas the plurality of times and setting, at this time, the partial pressure of the precursor gas when the precursor gas is supplied for the first time to be lower than the partial pressure of the precursor gas when the precursor gas is supplied for at least one subsequent time after the first time, it is possible to suppress the self-decomposition of the precursor gas at the initial stage of supply of the precursor gas. Thereafter, it is possible to cause atoms or molecules contained in the precursor gas to be efficiently adsorbed over the entire region in the recess by relatively increasing the partial pressure of the precursor gas when causing atoms or molecules contained in the precursor gas to be adsorbed on the inside of the recess, while relaxing the state of suppression of self-decomposition of the precursor gas. As a result, it is possible to improve the step coverage without lowering the deposition rate of the film formed on the wafer 200. Further, it is possible to improve the wafer in-plane film thickness uniformity of the film formed on the wafer 200.

(i) In Step A, by dividing and supplying the precursor gas the plurality of times and setting, at this time, the pressure of the space where the wafer 200 exists (the internal pressure of the process camber 201) when the precursor gas is supplied for the first time to be lower than the internal pressure of the process camber 201 when the precursor gas is supplied for at least one subsequent time after the first time, it is possible to suppress the self-decomposition of the precursor gas at the initial stage of supply of the precursor gas. Thereafter, it is possible to cause atoms or molecules contained in the precursor gas to be efficiently adsorbed over the entire region in the recess by relatively increasing the internal pressure of the process camber 201 when causing atoms or molecules contained in the precursor gas to be adsorbed on the inside of the recess, while relaxing the state of suppression of self-decomposition of the precursor gas. As a result, it is possible to improve the step coverage without lowering the deposition rate of the film formed on the wafer 200. Further, it is possible to improve the wafer in-plane film thickness uniformity of the film formed on the wafer 200.

Further, in Step A, the precursor gas may be supplied separately the plurality of times, and at this time, the internal pressure of the process camber 201 when the precursor gas is supplied for the first time may be set to be equal to or higher than the internal pressure of the process camber 201 when the precursor gas is supplied for at least one subsequent time after the first time. In this case, by setting the supply flow rate of the inert gas supplied into the process chamber 201 when the precursor gas is supplied for the first time to be higher than the supply flow rate of the inert gas supplied into the process chamber 201 when the precursor gas is supplied for at least one subsequent time after the first time, the partial pressure of the precursor gas when the precursor gas is supplied for the first time may be made lower than the partial pressure of the precursor gas when the precursor gas is supplied for the at least one subsequent time, making it possible to obtain the same effects as the above-described effects.

(j) In Step A, by alternately performing Step a1 and Step a2 the plurality of times, even in a case where intermediates are generated during the supply of the precursor gas, it is possible to cause atoms or molecules contained in the precursor gas to be adsorbed on the inside of the recess while efficiently removing the intermediates. That is, it is possible to suppress the inhibition of film formation caused by excessive generation of intermediates. As a result, it is possible to improve the step coverage without lowering the deposition rate of the film formed on the wafer 200. Further, it is possible to improve the wafer in-plane film thickness uniformity of the film formed on the wafer 200.

(k) As described above, according to the embodiments of the present disclosure, it is possible to improve the step coverage of the film formed on the wafer 200. For example, according to the embodiments, the step coverage of at least 70% may be obtained. Further, for example, according to any one of the above-described methods in the embodiments, the step coverage of 80% or more may be obtained. Further, for example, according to any one of the above-described methods in the embodiments, the step coverage of 85% or more may be obtained. Furthermore, for example, according to any one of the above-described methods in the embodiments, the step coverage of 90% or more may be obtained.

(l) In Step A, by dividing and supplying the precursor gas the plurality of times (m times, where m is an integer of 2 or more) and setting, at this time, the duration of Step a2 performed initially (for the first time) to be shorter than the duration of Step a2 performed finally (for the m-th time), a total purge time is shortened, making it possible to suppress the decrease in the deposition rate.

(m) In Step A, by dividing and supplying the precursor gas the plurality of times (m times, where m is an integer of 2 or more) and setting, at this time, in the case of m≥3, the duration of Step a2 performed for the second time to be shorter than the duration of Step a2 performed finally (for the m-th time), the total purge time is shortened, making it possible to suppress the decrease in the deposition rate. In this case, the duration of Step a2 performed for each of the first to (m−1)-th times may be shorter than the duration of Step a2 performed finally (m-th time), thereby shortening the total purge time, making it possible to suppress the decrease in the deposition rate.

(n) In Step A, by dividing and supplying the precursor gas the plurality of times (m times, where m is an integer of 2 or more) and setting, at this time, the duration of Step a2 performed finally (for the m-th time) to be the longest among the durations of Step a2 performed the plurality of times, the total purge time is shortened, making it possible to suppress the decrease in the deposition rate. Further, in Step A, it is possible to sufficiently suppress the residual of the precursor gas in the process chamber 201 after Step a1 performed finally (for the m-th time) among those performed the plurality of times is completed. As a result, when Step B is performed thereafter, it is possible to avoid mixture of the precursor gas and the reaction gas in the process chamber 201, making it possible to suppress the generation of particles. This makes it possible to improve the film quality of the film formed on the wafer 200.

Further, in Step A, when the precursor gas is supplied separately the plurality of times (m times, where m is an integer of 2 or more), the reaction gas is supplied into the process chamber 201 immediately after Step a2 performed finally (for the m-th time) is completed. Therefore, Step a2 performed finally (for the m-th time) may be sufficiently performed to avoid the generation of particles due to mixture of the precursor gas remaining in the process chamber 201 and the reaction gas supplied into the process chamber 201. On the other hand, the precursor gas is supplied into the process chamber 201 immediately after Step a2 performed for each of the first to (m−1)-th times is completed. Therefore, there is a possibility that the precursor gas remaining in the process chamber 201 and the precursor gas supplied into the process chamber 201 are mixed, but even in the case where they are mixed, since they are the same substance, no particles are generated. Therefore, in Step a2 performed for each of the first to (m−1)-th times, it is possible to make the purge time shorter than that in Step a2 performed finally (for the m-th time).

(o) The above-described effects may be similarly obtained even when the above-described various precursor gases, reaction gases, and inert gases are used. However, the above-described effects are remarkably obtained when a halosilane gas is used as the precursor gas. Moreover, the above-described effects are particularly remarkably obtained when a chlorosilane gas is used as the precursor gas.

Other Embodiments of the Present Disclosure

The embodiments of the present disclosure are specifically described above. However, the present disclosure is not limited to the above-described embodiments, and various changes may be made without departing from the gist thereof.

In addition to the above-mentioned N- and H-containing gas and N-, C- and H-containing gas, examples of the reaction gas may include carbon (C)-containing gases such as an ethylene ($C_2H_4$) gas, an acetylene ($C_2H_2$) gas, and a propylene ($C_3H_6$) gas, boron (B)-containing gases such as a diborane ($B_2H_6$) gas and a trichloroborane ($BCl_3$) gas, oxygen (O)-containing gases such as an oxygen ($O_2$) gas, an ozone ($O_3$) gas, plasma-excited $O_2$ gas (O2*), $O_2$gas+hydrogen ($H_2$) gas, water vapor ($H_2O$ gas), a hydrogen peroxide ($H_2O_2$) gas, a nitrous oxide ($N_2O$) gas, a nitric oxide (NO) gas, a nitrogen dioxide ($NO_2$) gas, a carbon monoxide (CO) gas, and a carbon dioxide ($CO_2$) gas, and the like. In the present disclosure, when two gases are described together, such as "$O_2$ gas+$H_2$ gas," it means a mixed gas of $H_2$ gas and $O_2$ gas. When a mixed gas is supplied, two gases may be mixed (pre-mixed) in a supply pipe and then supplied into the process chamber 201, or the two gases may be supplied separately from different supply pipes into the process chamber 201 and then mixed (post-mixed) in the process chamber 201. One or more selected from the group of these gases may be used as the reaction gas. These gases are different in molecular structure (chemical structure) from one another, and may be used as a first reaction gas, a second reaction gas, or a third reaction gas, which are described below.

Then, in addition to the SiN film and the SiCN film, the present disclosure may also be applied to cases where Si-containing films such as a silicon oxynitride film (SiON film), a silicon oxycarbide film (SiOC film), a silicon oxycarbonitride film (SiOCN film), a silicon borocarbonitride film (SiBCN film), a silicon boronitride film (SiBN film), and a silicon oxide film (SiO film) are formed on a substrate according to the film-forming sequences shown below. Processing procedures and processing conditions when supplying the precursor gas and the reaction gas may be, for example, the same as those in the respective steps of the above-described embodiments. These cases may also obtain the same effects as those of the above-described embodiments.

[(Precursor gas→Purging)×m→Reaction gas→Purging]×n

[(Precursor gas→Purging)×m→First reaction gas→Purging→Second reaction gas→Purging]×n

[(Precursor gas→Purging)×m→First reaction gas→Purging→Second reaction gas→Purging→Third reaction gas→Purging]×n Further, for example, the present disclosure may also be applied to cases where precursor gases containing metal elements such as aluminum (Al), titanium (Ti), hafnium (Hf), zirconium (Zr), tantalum (Ta), molybdenum (Mo), and tungsten (W) are used as the precursor gas to form metal element-containing films such as an aluminum nitride film (AlN film), a titanium nitride film (TiN film), a hafnium nitride film (HfN film), a zirconium nitride film (ZrN film), a tantalum nitride film (TaN film), a molybdenum nitride film (MoN), a tungsten nitride film (WN), an aluminum oxide film (AlO film), a titanium oxide film (TiO film), a hafnium oxide film (HfO film), a zirconium oxide film (ZrO film), a tantalum oxide film (TaO film), a molybdenum oxide film (MoO), a tungsten oxide film (WO), a titanium oxynitride film (TiON film), a titanium aluminum carbonitride film (TiAlCN film), a titanium aluminum carbide film (TiAlC film), and a titanium carbonitride film (TiCN film) on a substrate according to the above-described film-forming sequences. These precursor gases are gases being different in molecular structure (chemical structure), and in addition to acting as the above-described precursor gas, may also act as the above-described first reaction gas, second reaction gas, and third reaction gas. Processing procedures and processing conditions when supplying the precursor gas and the reaction gas may be, for example, the same as those in the respective steps of the above-described embodiments.

This case may also obtain the same effects as those of the above-described embodiments.

Recipes used in each process may be provided individually according to the processing contents and may be stored in the memory 121c via a telecommunication line or the external memory 123. Moreover, at the beginning of each process, the CPU 121a may properly select an appropriate recipe from the recipes stored in the memory 121c according to the processing contents. Thus, it is possible for a single substrate processing apparatus to form films of various kinds, composition ratios, qualities, and thicknesses with enhanced reproducibility. Further, it is possible to reduce an operator's burden and to quickly start each process while avoiding an operation error.

The recipes mentioned above are not limited to newly-provided ones but may be provided, for example, by modifying existing recipes that are already installed in the substrate processing apparatus. When the recipes are modified, the modified recipes may be installed in the substrate processing apparatus via a telecommunication line or a recording medium storing the recipes. In addition, the existing recipes already installed in the existing substrate processing apparatus may be directly modified by operating the input/output device 122 of the substrate processing apparatus.

An example in which a film is formed by using a batch-type substrate processing apparatus capable of processing a plurality of substrates at a time is described in the above-described embodiments. The present disclosure is not limited to the above-described embodiments, but may be suitably applied, for example, to a case where a film is formed by using a single-wafer type substrate processing apparatus capable of processing a single substrate or several substrates at a time. In addition, an example in which a film is formed by using a substrate processing apparatus including a hot-wall-type process furnace is described in the above-described embodiments. The present disclosure is not limited to the above-described embodiments, but may also be suitably applied to a case where a film is formed by using a substrate processing apparatus including a cold-wall-type process furnace.

Even in the case of using these substrate processing apparatuses, each process may be performed according to the same processing procedures and processing conditions as those in the above-described embodiments and modifications, and the same effects as the above-described embodiments and modifications are achieved.

The above-described embodiments and modifications may be used in proper combination. The processing procedures and processing conditions used in this case may be the same as, for example, the processing procedures and processing conditions in the above-described embodiments and modifications.

Examples

As an Example, by using the above-described substrate processing apparatus, a SiN film is formed as a film on a wafer provided with a recess on a surface of the wafer according to the film-forming sequence shown in FIG. 4, whereby a first evaluation sample is provided. When providing the first evaluation sample, a HCDS gas is used as a precursor gas, and a $NH_3$ gas is used as a reaction gas. A processing condition is set to a predetermined condition within a range of the processing conditions described in the above-described embodiments.

As a Comparative Example, by using the above-described substrate processing apparatus, by performing a cycle a plurality of times, the cycle including non-simultaneously performing a step of supplying a HCDS gas and a step of supplying a $NH_3$ gas, a SiN film is formed as a film on a wafer provided with a recess on a surface of the wafer, whereby a second evaluation sample is provided. When providing the second evaluation sample, in the step of supplying the HCDS gas, a supply duration of the HCDS gas per cycle is set to be the same as a total supply duration of the HCDS gas per cycle in the Example. Other processing conditions are set to the same as those in a step of supplying the HCDS gas at the second time in the step of supplying the HCDS gas a plurality of times in the Example. Other processing conditions, including a processing condition in the step of supplying the $NH_3$ gas, are set to the same as the processing conditions in the Example.

Then, the step coverage of the SiN film in the recess of the first evaluation sample of the Example and the step coverage of the SiN film in the recess of the second evaluation sample of the Comparative Example are respectively measured. As a result, it is confirmed that the step coverage of the SiN film in the second evaluation sample of the Comparative Example is less than 90%, whereas the step coverage of the SiN film in the first evaluation sample of the Example is 90% or more, which exceeds the step coverage of the SiN film in the second evaluation sample of the Comparative Example.

According to the present disclosure, it is possible to provide a technique capable of improving a step coverage without lowering a deposition rate of a film formed on a substrate.

While certain embodiments are described above, these embodiments are presented by way of example, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:
forming a film on a substrate including a recess formed on a surface of the substrate by performing a cycle a predetermined number of times, the cycle including:
(a) supplying a precursor gas to the substrate; and
(b) supplying a reaction gas to the substrate,
wherein in (a), the precursor gas is supplied to the substrate separately a plurality of times, and a processing condition under which the precursor gas is supplied for a first time is set to a processing condition under which self-decomposition of the precursor gas is capable of being more suppressed than a processing condition under which the precursor gas is supplied for at least one subsequent time after the first time.

2. The method of claim 1, wherein in (a), the processing condition under which the precursor gas is supplied for the first time is set to a processing condition under which generation of intermediates of the precursor gas is capable of being more suppressed than the processing condition under which the precursor gas is supplied for the at least one subsequent time.

3. The method of claim 1, wherein in (a), the processing condition under which the precursor gas is supplied for the first time is set to a processing condition under which self-decomposition of the precursor gas is capable of being suppressed, and the processing condition under which the precursor gas is supplied for the at least one subsequent time is set to a processing condition under which the precursor gas is self-decomposed.

4. The method of claim 1, wherein in (a), the processing condition under which the precursor gas is supplied for the first time is set to a processing condition under which generation of intermediates of the precursor gas is capable of being suppressed, and the processing condition under which the precursor gas is supplied for the at least one subsequent time is set to a processing condition under which intermediates of the precursor gas are generated.

5. The method of claim 1, wherein in (a), a supply duration of the precursor gas when the precursor gas is supplied for the first time is set to be shorter than a supply duration of the precursor gas when the precursor gas is supplied for the at least one subsequent time.

6. The method of claim 1, wherein in (a), a supply flow rate of the precursor gas when the precursor gas is supplied for the first time is set to be smaller than a supply flow rate of the precursor gas when the precursor gas is supplied for the at least one subsequent time.

7. The method of claim 1, wherein (a) includes supplying a carrier gas, and in (a), a supply flow rate of the carrier gas when the precursor gas is supplied for the first time is set to be larger than a supply flow rate of the carrier gas when the precursor gas is supplied for the at least one subsequent time.

8. The method of claim 1, wherein in (a), a partial pressure of the precursor gas when the precursor gas is supplied for the first time is set to be lower than a partial pressure of the precursor gas when the precursor gas is supplied for the at least one subsequent time.

9. The method of claim 1, wherein in (a), a pressure of a space where the substrate is placed when the precursor gas is supplied for the first time is set to be lower than a pressure of the space where the substrate is placed when the precursor gas is supplied for the at least one subsequent time.

10. The method of claim 1, wherein (a) includes alternately performing, one or more times:
supplying the precursor gas to the substrate; and
purging a space where the substrate is placed.

11. The method of claim 10, wherein in (a), a duration of purging the space where the substrate is placed, which is performed after supplying the precursor gas for the first time, is set to be shorter than a duration of purging the space where the substrate is placed, which is performed after supplying the precursor gas for a final time.

12. The method of claim 11, wherein in (a), a duration of purging the space where the substrate is placed, which is performed after supplying the precursor gas for the at least one subsequent time, is set to be shorter than the duration of purging the space where the substrate is placed, which is performed after supplying the precursor gas for the final time.

13. The method of claim 10, wherein in (a), a duration of purging the space where the substrate is placed, which is performed after supplying the precursor gas for a final time, is set to be the longest among durations of purging the space where the substrate is placed.

14. The method of claim 1, wherein the precursor gas includes a halosilane gas.

15. The method of claim 1, wherein the precursor gas includes a chlorosilane gas.

16. The method of claim 1, wherein when the film is formed on the substrate, the cycle is performed the predetermined number of times to obtain a step coverage of 80% or more.

17. The method of claim 1, wherein when the film is formed on the substrate, the cycle is performed the predetermined number of times to obtain a step coverage of 85% or more.

18. The method of claim 1, wherein when the film is formed on the substrate, the cycle is performed the predetermined number of times to obtain a step coverage of 90% or more.

19. A method of manufacturing a semiconductor device comprising the method of claim 1.

20. A substrate processing apparatus comprising:
a process chamber in which a substrate is processed;
a precursor gas supply system configured to supply a precursor gas to the substrate in the process chamber;
a reaction gas supply system configured to supply a reaction gas to the substrate in the process chamber;
a heater configured to heat the substrate in the process chamber; and
a controller configured to be capable of controlling the precursor gas supply system, the reaction gas supply system, and the heater to perform a process in the process chamber, the process including: forming a film on a substrate including a recess formed on a surface of the substrate by performing a cycle a predetermined number of times, the cycle including:
(a) supplying the precursor gas to the substrate; and
(b) supplying the reaction gas to the substrate,
wherein in (a), the precursor gas is supplied to the substrate separately a plurality of times, and a processing condition under which the precursor gas is supplied for a first time is set to a processing condition under which self-decomposition of the precursor gas is capable of being more suppressed than a processing condition under which the precursor gas is supplied for at least one subsequent time after the first time.

21. A non-transitory computer-readable recording medium storing a program that causes, by a computer, a substrate processing apparatus to perform a process comprising:
forming a film on a substrate including a recess formed on a surface of the substrate by performing a cycle a predetermined number of times, the cycle including:
(a) supplying a precursor gas to the substrate; and
(b) supplying a reaction gas to the substrate,
wherein in (a), the precursor gas is supplied to the substrate separately a plurality of times, and a processing condition under which the precursor gas is supplied for a first time is set to a processing condition under which self-decomposition of the precursor gas is capable of being more suppressed than a processing condition under which the precursor gas is supplied for at least one subsequent time after the first time.

* * * * *